United States Patent [19]
Jeng

[11] Patent Number: 5,706,164
[45] Date of Patent: Jan. 6, 1998

[54] METHOD OF FABRICATING HIGH DENSITY INTEGRATED CIRCUITS, CONTAINING STACKED CAPACITOR DRAM DEVICES, USING ELEVATED TRENCH ISOLATION AND ISOLATION SPACERS

[75] Inventor: Erik S. Jeng, Taipei, Taiwan

[73] Assignee: Vangaurd International Semiconductor Corporation, Hsin-Chu, Taiwan

[21] Appl. No.: 682,474

[22] Filed: Jul. 17, 1996

[51] Int. Cl.⁶ .................. H01G 4/06; H01L 27/108
[52] U.S. Cl. ............ 361/321.4; 257/296; 257/300; 257/306; 438/142; 438/197; 438/238; 438/239; 438/253
[58] Field of Search .......... 257/301, 303–305, 257/306–307, 310–311, 296, 298–300; 361/321.1–321.5; 29/25.42; 438/142, 197, 238, 239–240, 253, 256

[56] References Cited

U.S. PATENT DOCUMENTS

| | | | |
|---|---|---|---|
| 5,356,828 | 10/1994 | Swan et al. | 437/67 |
| 5,383,088 | 1/1995 | Chapple-Sokol et al. | 361/305 |
| 5,447,884 | 9/1995 | Fahey et al. | 437/67 |

*Primary Examiner*—Bot L. Ledynh
*Attorney, Agent, or Firm*—George O. Saile; Stephen B. Ackerman

[57] ABSTRACT

A process for fabricating stacked capacitor structure, DRAM devices, has been developed, in which the surface area of the stacked capacitor structure has been increased as a result of the topography created via the use of underlying insulator filled, shallow trenches, insulator protected polycide gate structures, and insulator protected bit line contact structures.

29 Claims, 6 Drawing Sheets

1

METHOD OF FABRICATING HIGH DENSITY INTEGRATED CIRCUITS, CONTAINING STACKED CAPACITOR DRAM DEVICES, USING ELEVATED TRENCH ISOLATION AND ISOLATION SPACERS

BACKGROUND OF THE INVENTION

1. Field of the Invention

The present invention relates to methods used to fabricate semiconductor devices, and more specifically to fabrication procedures used to create smaller semiconductor devices, thus allowing increased circuit densities to be achieved.

2. Background of the Invention

The semiconductor industry is continually striving to increase the performance of semiconductor devices, while still maintaining, or decreasing the cost of these devices. These objectives have been addressed by the trend to semiconductor devices with smaller dimensions. Smaller devices, with smaller features result in decreases in parasitic capacitance, as well as decrease in resistances, both allowing higher performance devices to be realized. In addition the smaller specific devices allows a greater number of semiconductor chips to be obtained from a specific size starting wafer, then would have been available using larger devices with larger features, thus cost reductions, in terms of more semiconductor chips for a specific size wafer, is realized. The reduction in device dimension has been arrived at mainly by advances in specific semiconductor fabrication disciplines, such as photolithography and anisotropic, reactive ion etching, (RIE). For example more sophisticated exposure cameras, as well as the development of more sensitive photoresist materials, have resulted in the routine attainment of sub-micron images, in photoresist layers. In addition similar advances in the dry etching sectors have allowed the successful transfer of these sub-micron images in photoresist layers, to underlying materials, used for the creation of advanced semiconductor devices. Other semiconductor fabrication disciplines, such as low pressure chemical vapor deposition, and ion implantation, have also greatly contributed to the attainment of smaller semiconductor devices.

However the ability to produce smaller semiconductor devices has also been aided by specific structural enhancements. For example the development of the insulator sidewall spacer concept has allowed self aligned metal contacts, specifically salicide procedures, to be performed to source and drain, and gate structures, allowing sub-micron features to be obtained without the use of dimension limiting, photolithographic procedures. In addition the development of the shallow trench structure, for device isolation purposes, replacing thermally grown field oxide structures, has also resulted in the significant reductions in device size, specifically by eliminating the loss of the silicon area that was consumed by birds beak formation during the thermal oxidation of the field region.

This invention will describe a process for fabricating a stacked capacitor, dynamic random access memory, (DRAM), device, using elevated trench isolation, (ETI). This structural enhancement results in improved planarity and reduction in device size, when compared to counterparts fabricated with conventional thermal field oxide regions, but will also feature a process in which photomasking steps can be avoided, through self alignment procedures, arrived at via the ETI structure. Other descriptions of shallow trench isolation processes, such as Fahey, et al, in U.S. Pat. No. 5,447,884, and Swan, et al, in U.S. Pat. No. 5,356,828, show processes used to form shallow trench isolation and improved planarization, but do not show the creation of advanced devices, using reduction of photomasking steps, thus allowing smaller features to be utilized.

SUMMARY OF THE INVENTION

It is an object of this invention to use elevated trench isolation to improve the planarity of devices contained within the elevated trench isolation regions.

It is another object of this invention to use insulator sidewall spacers to separate capacitor node structures from bit line contact structures, for stacked capacitor, DRAM devices.

It is yet another object of this invention to create contact openings for capacitor node structures and bit line contact structures, without the use of photolithographic processing.

It is still another object of this invention to form metal structures on the elevated trench isolation regions, and to use the difference in topography between the metal structures, overlying the elevated trench isolation regions, and the lower regions between these metal structures, to create a lower electrode for a stacked capacitor structure, with raised extensions, resulting in increased lower electrode surface area, thus increasing capacitance of the stacked capacitor structure.

In accordance with this invention a method for fabricating high density integrated circuits, containing stacked capacitor DRAM devices, using oxide filled, elevated trench isolation and insulator sidewall spacers, is described. A shallow trench is etched in a layer of silicon oxide, a layer of first polysilicon, a silicon dioxide gate insulator, and into a semiconductor substrate. The trench is filled with silicon oxide and planarized to expose the top surface of the first polysilicon layer in non-trench regions. After deposition of a metal silicide and an overlying silicon oxide layer, patterning of the silicon oxide layer, of the metal silicide layer, and of the first polysilicon layer, is performed to create a gate electrode structure, with the top surface of the first polysilicon, in the gate electrode structure, equal in height to the top surface of the oxide in the shallow trench, thus resulting in an oxide filled trench, elevated in regards to the underlying substrate. After creation of insulator sidewall spacers on the exposed sides of gate electrode structures, source and drain regions are formed in areas between the gate electrode structures. Another deposition of a second polysilicon layer, a metal silicide layer, and a silicon oxide layer, is performed, and patterning of these layers is used to create a bit line contact structure, situated between two gate electrode structures, while leaving a portion of the second polysilicon layer remaining in an area between a gate electrode structure and a elevated, oxide filled trench. After creation of insulator sidewall spacers, on the exposed sides of the bit line contact structures, a third polysilicon layer is deposited. Patterning of the third and second polysilicon layers is performed to create the storage node of a stacked capacitor structure, with the surface area of the storage node increased as a result of the topology created by an section of the third polysilicon layer overlying the elevated, oxide filled trench, while the remaining polysilicon overlies the lower source and drain region. A capacitor dielectric layer is next formed, followed by deposition of a fourth polysilicon layer, and patterning of the fourth polysiliocn layer, to create the cell plate of the stacked capacitor structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
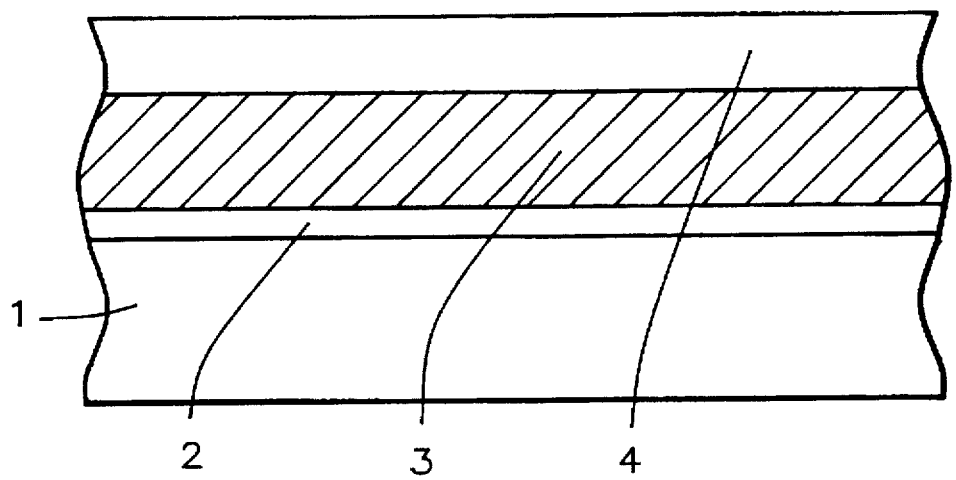
FIGS. 1–3, which schematically, in cross-sectional style, show the formation of the oxide, filled, elevated trench.

The method of fabricating high density integrated circuits, containing stacked capacitor DRAM devices, using elevated trench isolation and isolation spacers, will now be covered in detail. FIG. 1, shows a P type, silicon substrate, 1, composed of silicon with a <100> crystallographic orientation. A silicon dioxide layer, 2, is thermally grown at a temperature between about 850° to 1000° C., to a thickness between about 50 to 100 Angstroms, to be used for the gate insulator. A first polysilicon layer, 3, is deposited, using low pressure chemical vapor deposition, (LPCVD), procedures, at a temperature between about 450° to 650° C., to a thickness between about 500 to 2000 Angstroms. Polysilicon layer, 3, can be deposited using insitu doping procedures, by the addition of phosphine to a silane ambient, or polysilicon layer, 3, can be grown intrinsically, and doped via ion implantation of phosphorous, at an energy between about 50 to 100 Kev, at a dose between about 5E14 to 1E16 atoms/cm$^2$. Next a layer of silicon oxide, 4, is deposited using either LPCVD or plasma enhanced chemical vapor deposition, (PECVD), processing, at a temperature between about 300° to 800° C., to a thickness between about 1000 to 3000 Angstroms, using tetraethylorthosilicate, (TEOS), as a source.

Figure 2:
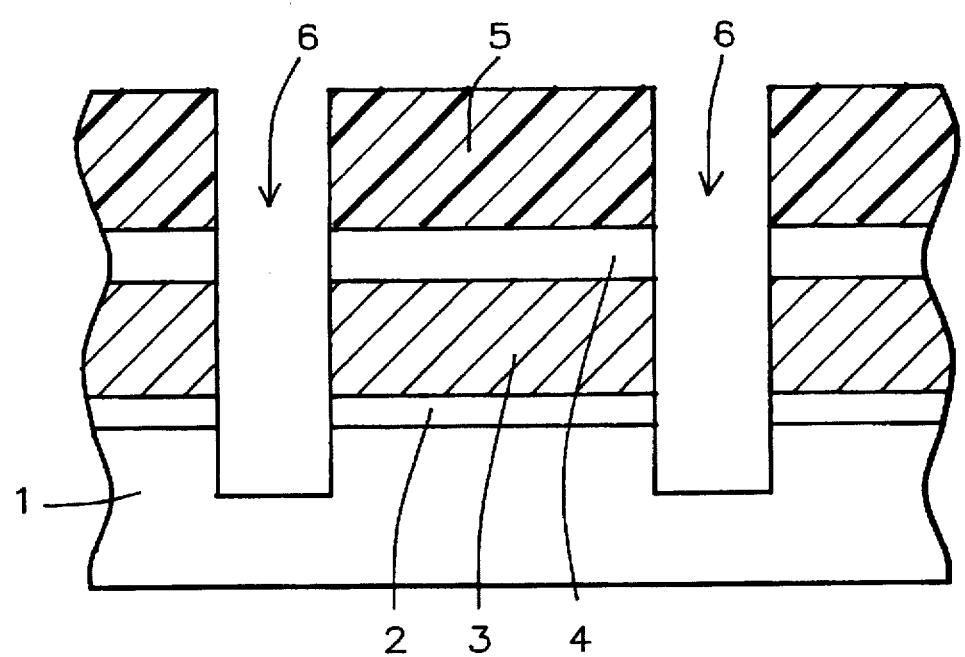
Figure 3:
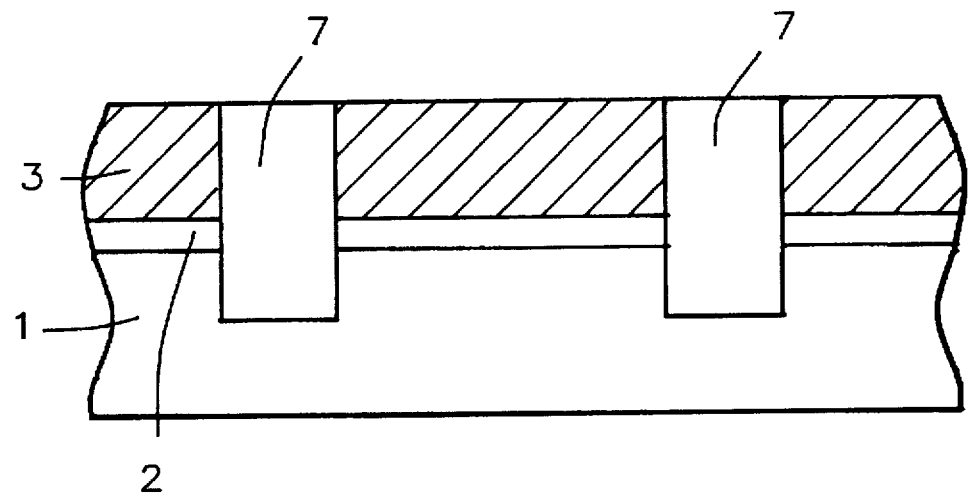

Photolithographic procedures are used to form photoresist feature, 5, followed by the creation of the shallow trench, 6, shown schematically in FIG. 2. Shallow trench, 6, is created via anisotropic, reactive ion etching, (RIE), using CHF$_3$ as an etchant for silicon oxide layer, 4, Cl$_2$ as an etchant for first polysilicon layer, 3, CHF$_3$ as an etchant for silicon dioxide layer, 2, and finally Cl$_2$ as an etchant for silicon substrate, 1. The depth of shallow trench, 6, in substrate, 1, is between about 3000 to 5000 Angstroms, from the top surface of substrate, 1, to the bottom of shallow trench, 6. Photoresist removal is performed using plasma oxygen ashing and careful wet cleans. The deposition of a TEOS oxide, 7, is next performed, at a temperature between about 600° to 800° C., to a thickness between about 1500 to 5000 Angstroms, completely filling shallow trench, 6. Planarization of the TEOS oxide layer, 7, resulting in removal of this insulator from all regions, except from shallow trench, 6, is next addressed. The planarization process is accomplished by either chemical mechanical polishing, with the procedure terminating with the appearance of the top surface of first polysilicon layer, 3. A similar result can be achieved via RIE etchback of TEOS oxide layer, 7, using CHF$_3$ as an etchant, and laser endpointing with the appearance of the top surface of first polysilicon layer, 4. FIG. 3, shows the result of the planarization procedures, with the oxide filled, shallow trench now elevated above the top surface of substrate, 1, by the height of gate insulator layer, 2, and first polysilicon layer, 3.

Figure 4:
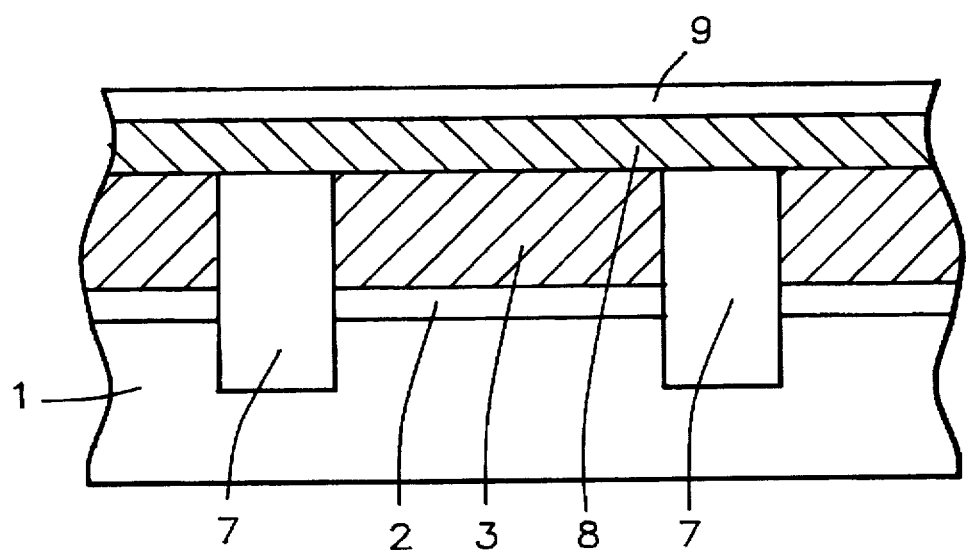
FIGS. 4–6, which schematically, in cross-sectional style, describe the stages of processing used to create the gate electrode structure and the source and drain regions.
Figure 5:
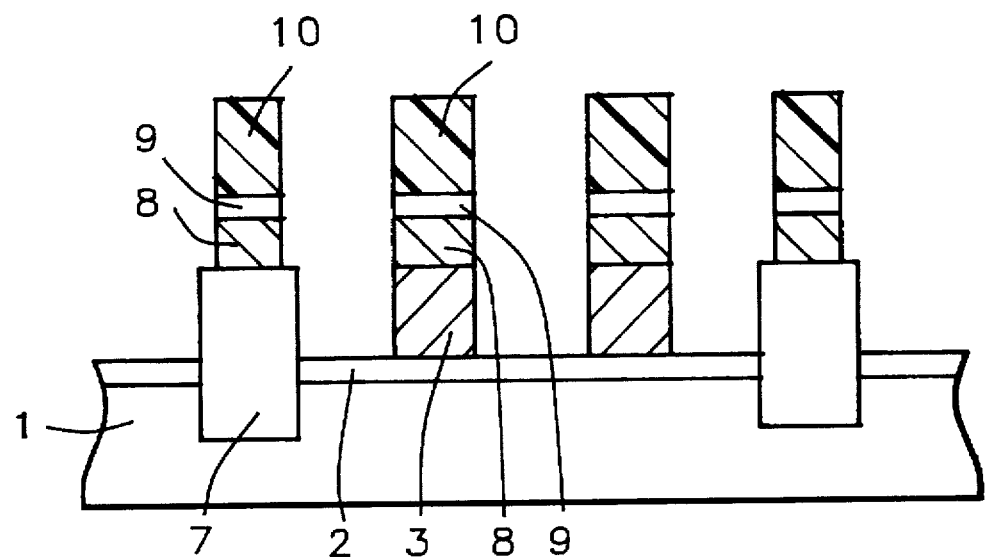

A first layer of tungsten silicide, 8, is deposited using LPCVD procedures, at a temperature between about 400° to 700° C., to a thickness between about 500 to 1500 Angstroms, using tungsten hexafluoride and silane as source materials, followed by the deposition of silicon oxide layer, 9, obtained via LPCVD or PECVD procedures, at a temperature between about 300° to 800° C., to a thickness between about 1000 to 3000 Angstroms. FIG. 4, shows the result of the deposition of these layers. Photolithographic processing is next performed, forming photoresist features, 10, and functioning as a mask to create a gate electrode structure. This is accomplished by anisotropic RIE procedures, using CHF$_3$ and CF$_4$ as etchants for silicon oxide layer, 9, and Cl$_2$, HBr and O$_2$ as etchants for tungsten silicide layer, 8, and first polysilicon layer, 3, creating gate electrode structures between oxide filled, shallow trenches. In addition this patterning procedure also results in the formation of a metal land structure, composed of silicon oxide layer, 9 and tungsten silicide layer, 8, on the elevated, oxide filled, trench. This is shown schematically in FIG. 5. Photoresist removal is performed using plasma oxygen ashing and careful wet cleans.

Figure 6:
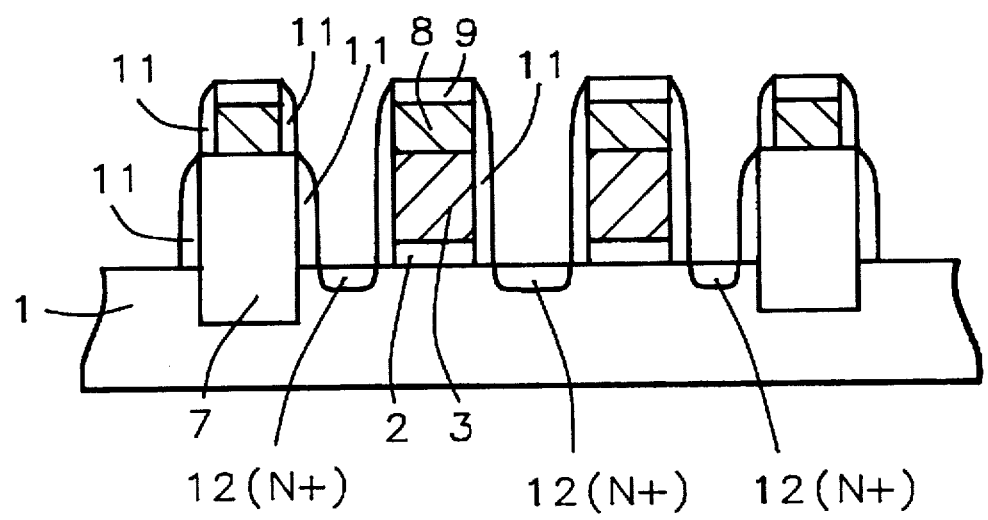
Figure 7:
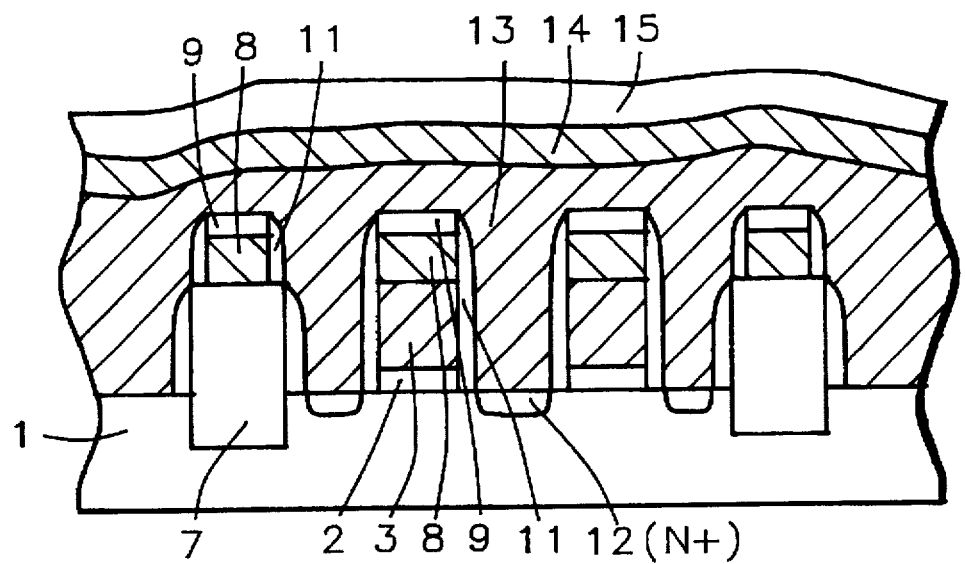
FIGS. 7–9, which schematically, in cross-sectional style, show the formation of a bit line contact structure.

A silicon oxide layer is deposited, using either LPCVD or PECVD procedures, at a temperature between about 300° to 800° C., to a thickness between about 500 to 1500 Angstroms, and subjected to an anisotropic RIE procedure, using, CHF$_3$ as an etchant, to form first insulator sidewall spacer, 11, on the sides of the gate electrode and metal land structures, and shown schematically in FIG. 6. Source and drain regions, 12, also shown schematically in FIG. 6, are created via ion implantation of arsenic or phosphorous, at an energy between about 30 to 80 Kev, at a dose between about 1E13 to 1E15 atoms/cm$^2$. A second layer of polysilicon, 13, is deposited using LPCVD procedures, at a temperature between about 400° to 700° C., to a thickness between about 500 to 2000 Angstroms. Polysilicon layer, 13, can be grown using insitu doping procedures, identical to insitu doping procedures used for polysilicon layer, 3, or grown intrinsically and doped via ion implantation of phosphorous at an energy between about 50 to 100 Kev, at a dose between about 5E14 to 1E16 atoms/cm$^2$. The polysilicon deposition completely fills the spaces between gate electrode structures, and between the gate electrode and metal land structures, on the elevated trenches, and thus is thicker in those spaces then in regions in which polysiliocn layer, 13, overlies gate electrode structures. A second layer of tungsten silicide, 14, is deposited on polysilicon layer, 13, via LPCVD procedures, at a temperature between about 400° to 600° C., to a thickness between about 500 to 1500 Angstroms, using tungsten hexafluoride and silane, followed by the deposition of silicon oxide layer, 15, obtained via either LPCVD or PECVD procedures, at a temperature between about 300° to 800° C., to a thickness between about 1000 to 2000 Angstroms. A silicon nitride layer can be used in place of silicon oxide layer, 15, if desired. The result of these depositions is schematically shown in FIG. 7.

Figure 8:
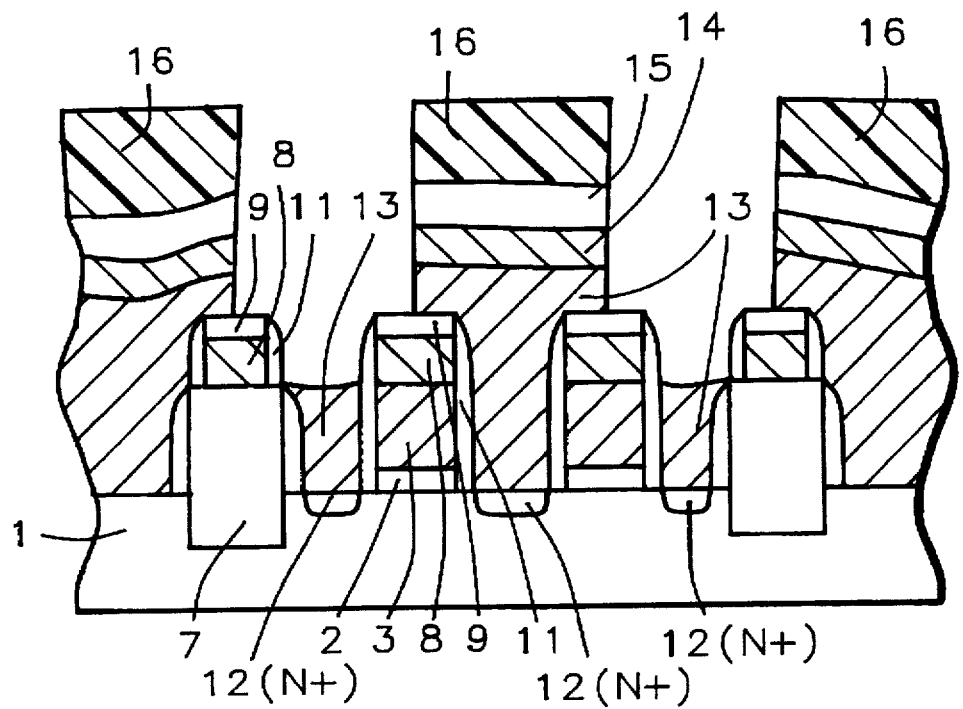
Figure 9:
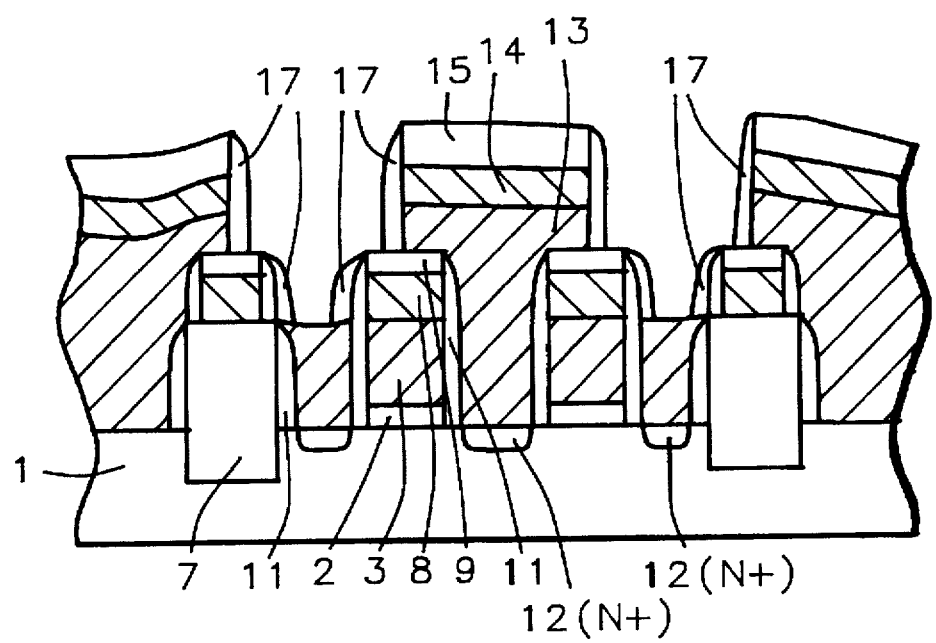

FIG. 8, shows the formation of the bit line contact structure, as well as the initial fabrication phase for the lower electrode, or storage node, of the stacked capacitor structure. Conventional photolithographic procedures are employed to create photoresist shape, 16. A RIE procedure, using CHF$_3$ and CF$_4$ is used to pattern silicon oxide layer, 15, while Cl$_2$, SF$_6$ and HBr is used as etchants for the second tungsten silicide layer, 14. The anisotropic RIE procedure continues, using Cl$_2$, HBr and O$_2$ as etchants to completely pattern second polysilicon layer, 13, in areas where polysilicon layer, 13, overlies either gate electrode structures or metal land structures. However in regions between gate electrode and metal land structures, the thicker polysilicon layer, 13, is only removed to a level equal to the top surface of the oxide filled, elevated trench. Photoresist shape, 16, is then removed via plasma oxygen ashing and careful wet cleans. A silicon oxide layer is next deposited, and subjected to an anisotropic RIE procedure, using $CHF_3$ and $CF_4$ as etchants, to form second insulator sidewall spacer, 17, on the sides of the bit line contact structures. This is shown schematically in FIG. 9.

Figure 10:
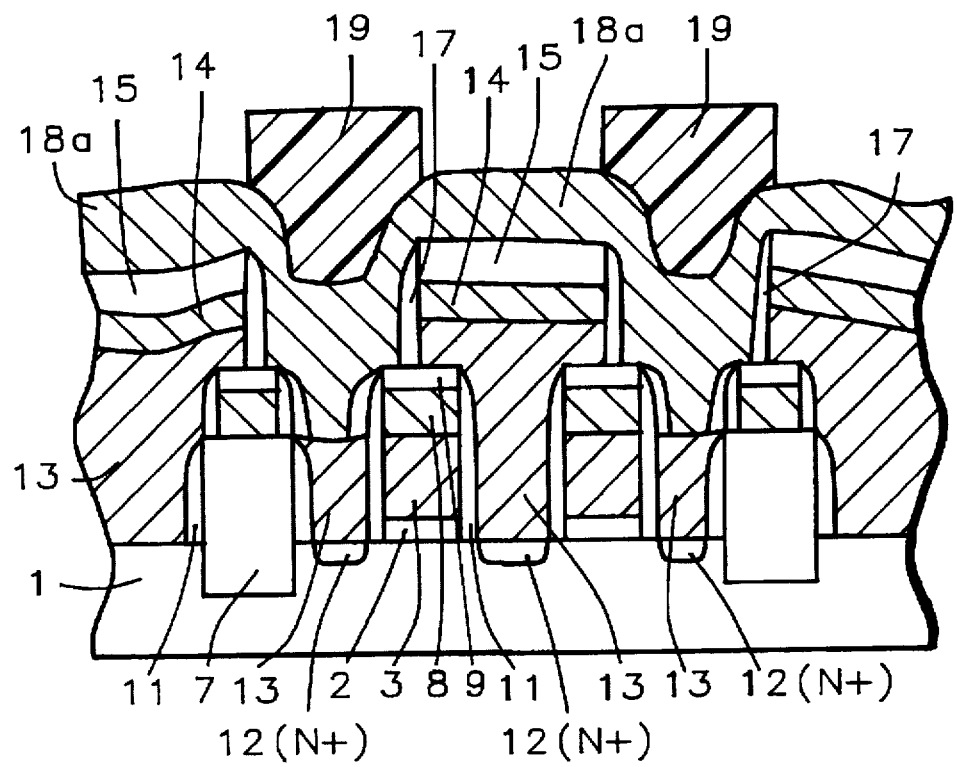
FIGS. 10–12, which schematically, in cross-sectional style, show the formation of the stacked capacitor structure.
Figure 11:
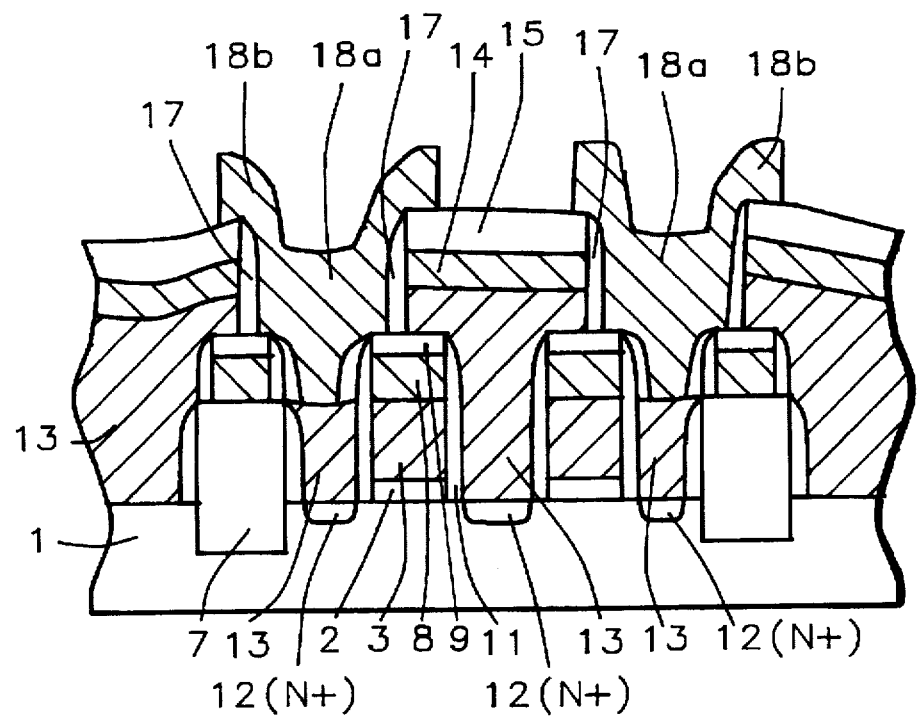

A third polysilicon layer, 18a, is next deposited, on second polysilicon layer, 13, in regions between gate electrode and metal land structures, as well as on the bit contact structures, completely encapsulated by silicon oxide layer, 15, and second insulator sidewall spacer, 17. The polysilicon layer, 18a, is deposited using LPCVD processing, at a temperature between about 400° to 700° C., to a thickness between about 3000 to 8000 Angstroms. Doping of third polysilicon layer, 18a, is once again accomplished either via insitu deposition techniques, or via a phosphorous ion implantation, into an intrinsically grown polysilicon layer. Conventional photolithographic procedures are used to obtain photoresist shape, 19, which will be used as a mask to define a lower electrode, or storage node, for a stacked capacitor structure. This is shown schematically in FIG. 10. Anisotropic RIE procedures, using $Cl_2$ as an etchant, are next employed to pattern third polysilicon layer, 18a, and create the lower electrode of the stacked capacitor structure. FIG. 11, schematically shows the etching of third polysilicon layer, 18a, resulting in a lower electrode shape, exhibiting polysilicon wings, 18b, or extended polysilicon features, in regions in which third polysilicon layer, 18a, overlaid the metal land on the oxide filled, elevated trenches. These polysilicon wings, 18b, increase the surface area of the lower electrode and thus will allow an increased capacitance, for the stacked capacitor structure to be realized, when compared to counterparts, fabricated without polysilicon wings. Photoresist shape, 19, is removed via plasma oxygen ashing and careful wet cleans.

Figure 12:
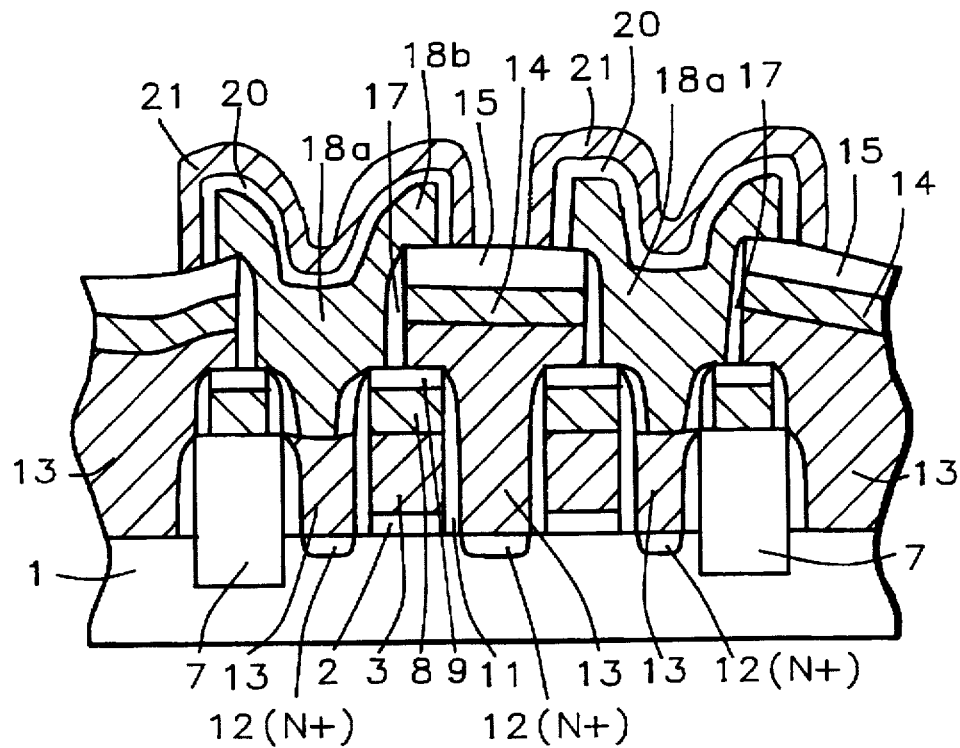

The stacked capacitor structure is completed by forming a dielectric layer, 20, on the lower electrode. Dielectric layer, 20, can be a thin silicon oxide layer, thermally grown to a thickness between about 10 to 50 Angstroms. Dielectric layer, 20, can also be a composite dielectric layer, comprised of an underlying thermally grown, silicon oxide layer, and an overlying layer of LPCVD grown, silicon nitride, subjected to thermal oxidation to convert the top surface of the silicon nitride layer to a silicon oxynitride layer, resulting in an oxidized-nitride-oxide, (ONO), composite layer, with an equivalent silicon dioxide thickness between about 40 to 80 Angstroms. A fourth polysilicon layer, 21, is deposited, again using LPCVD procedures, at a temperature between about 400° to 700° C., to a thickness between about 1000 to 2000 Angstroms. Doping of fourth polysilicon layer, 21, is again arrived at by either insitu doping deposition procedures, or phosphorous ion implantation of an intrinsically grown fourth polysilicon layer. Patterning of fourth polysilicon layer is accomplished via conventional photolithographic and anisotropic RIE procedures, using $Cl_2$ as an etchant. Photoresist removal is accomplished once again via plasma oxygen ashing and wet cleans. FIG. 12, schematically shows the completed stacked capacitor structure, with polysilicon wings, 18b, for enhanced capacitance, and isolated from the bit contact structures, by use of insulator layer, 15, and sidewall spacer, 17.

Although this invention has been applied to N channel, DRAM devices, it can easily be incorporated into P channel, DRAM devices.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a stacked capacitor structure, dynamic random access memory, (DRAM), device, on a semiconductor substrate, comprising the steps of:

growing a gate dielectric layer on the surface of said semiconductor substrate;

depositing a first polysilicon layer on said gate dielectric layer;

depositing a first insulator layer on said first polysilicon layer;

patterning to create a shallow trench in said first insulator layer, in said first polysilicon layer, in said gate dielectric layer, and in said semiconductor substrate;

depositing a second insulator layer on the top surface of said first insulator layer and completely filling said shallow trench;

removal of said second insulator layer, and of said first insulator layer, from top surface of said first polysilicon layer, resulting in said second insulator layer, in said shallow trench, at a level equal in height to the top surface of said first polysilicon layer;

deposition of a first metal silicide layer on top surface of said first polysilicon layer, and on top surface of said second insulator layer, in said shallow trench;

deposition of a third insulator layer on said first metal silicide layer;

patterning of said third insulator layer, of said first metal silicide layer, and of said first polysilicon layer, to create a polycide gate structure, on said gate dielectric layer, and patterning of said third insulator layer, and of said first metal silicide layer, to create a metal land structure on top surface of said second insulator layer, in said shallow trench, with top surfaces of said metal land structure and of said polycide gate structures at the same level;

deposition of a fourth insulator layer;

anisotropic etching of said fourth insulator layer, to create a first insulator spacer, on the sidewalls of said polycide gate structures, to remove said gate dielectric layer from between said polycide gate structures, and also to create said first insulator spacer on said metal land structures;

ion implanting a first conductivity imparting dopant into said semiconductor substrate, in regions between said polycide gate structures, to create source and drain regions;

depositing a second polysilicon layer on top surface of said third insulator layer, on said polycide gate structures and on said metal land structures, and completely filling spaces between said polycide gate structures, and spaces between said metal land structures and said polycide gate structures;

depositing a second metal silicide layer on said second polysilicon layer;

depositing a fifth insulator layer on said second metal silicide layer;

patterning of said fifth insulator layer, of said second metal silicide layer, and of said second polysilicon layer, to create a bit line contact structure to said source and drain region, between said polycide gate structures, and partially overlying said polycide gate structure, while leaving some said second polysilicon layer between said polycide gate structures and said metal land structures;

depositing a sixth insulator layer;

anisotropic etching of said sixth insulator layer to create a second insulator spacer on the sidewalls of said bit line contact structure;

deposition of a third polysilicon layer on top surface of said bit line contact structures, on top surface of said metal land structures, not covered by said bit line contact structures, on top surface of said polycide gate structures, not covered by said bit line contact structures, and on said second polysilicon layer, remaining between said polycide gate structures and said metal land structures;

patterning of said third polysilicon layer to create a lower electrode structure, of said stacked capacitor structure, between said bit line contact structures, with topography of said lower electrode structure exhibiting raised features in regions in which said lower electrode structure overlies said bit line contact structures, and shallow trench;

forming a capacitor dielectric layer on said lower electrode structure;

depositing a fourth polysilicon layer on said capacitor dielectric layer on said lower electrode structure, and on top surface of said bit line contact structures, not covered by said lower electrode structure; and patterning of said fourth polysilicon layer to form upper electrode, of said stacked capacitor structure.

2. The method of claim 1, wherein said first polysilicon layer is deposited using LPCVD processing, at a temperature between about 450° to 650° C., to a thickness between about 500 to 2000 Angstroms.

3. The method of claim 1, wherein bottom of said shallow trench is between about 3000 to 5000 Angstroms below the top surface of said semiconductor substrate.

4. The method of claim 1, wherein said second insulator layer, used to fill said shallow trench is silicon oxide, deposited using LPCVD or PECVD processing, at a temperature between about 600° to 800° C., to a thickness between about 1500 to 5000 Angstroms, using TEOS as a source.

5. The method of claim 1, wherein said second insulator layer, and said first insulator layer, are removed from top surface of said first polysilicon layer, using chemical mechanical polishing.

6. The method of claim 1, wherein said second insulator layer, and said first insulator layer, are removed from top surface of said first polysilicon layer, via RIE processing, using $CHF_3$ as an etchant.

7. The method of claim 1, wherein said first metal silicide layer is tungsten silicide, deposited using LPCVD processing, at a temperature between about 400° to 700° C., to a thickness between about 500 to 1500 Angstroms, using silane and tungsten hexafluoride a source.

8. The method of claim 1, wherein the height of said polycide structure, composed of said third insulator layer, said first metal silicide layer, and said first polysilicon layer, is between about 2000 to 6500 Angstroms.

9. The method of claim 1, wherein the height of said metal land structure, on said shallow trench, composed of said third insulator layer, and said first metal silicide layer, is between about 1500 to 4500 Angstroms.

10. The method of claim 1, wherein said first insulator spacer, on sidewalls of said polycide gate structures, and on sidewalls of said metal land structures, is silicon oxide, at a thickness between about 500 to 1500 Angstroms.

11. The method of claim 1, wherein the height of said bit line contact structure on said polycide gate structure, composed of said fifth insulator layer, of said second metal silicide layer, and of said second polysilicon layer, is between about 2000 to 5500 Angstroms.

12. The method of claim 1, wherein said second insulator spacer, on sidewalls of said bit line contact structures, is silicon oxide, at a thickness between about 500 to 1500 Angstroms.

13. The method of claim 1, wherein said raised features of said lower electrode structure, overlying said bit line contact structure, extend between about 3000 to 10000 Angstroms above top surface of the portion of said lower electrode structure, that overlies the space between said polycide gate structure and said metal land structure, on said shallow trench.

14. A method for fabricating a stacked capacitor structure, dynamic random access memory, (DRAM), device, on a semiconductor substrate, with increased capacitor surface area available via use of elevated shallow trench isolation and insulator sidewall spacers, comprising the steps of:

growing a gate dielectric layer on the surface of said semiconductor substrate;

depositing a first polysilicon layer on said gate dielectric layer;

depositing a first insulator layer on said first polysilicon layer;

patterning of said first insulator layer, of said first polysilicon layer, and of said semiconductor substrate, to a create a shallow trench;

depositing a second insulator layer on the top surface of said first insulator layer, and completely filling said shallow trench;

removal of said second insulator layer, and of said first insulator layer, from the top surface of said first polysilicon layer, resulting in said elevated shallow trench, filled with said second insulator layer, raised above top surface of said semiconductor substrate by an amount equal to the thickness of said first polysilicon layer;

deposition of a first tungsten silicide layer on the top surface of said first polysilicon layer, and on top surface of said second insulator layer, in said elevated shallow trench;

deposition of a third insulator layer on said first tungsten silicide layer;

patterning of said third insulator layer, of said first tungsten silicide layer, and of said first polysilicon layer, to create a polycide gate structure, on said gate dielectric layer, while patterning of said third insulator layer, and of said first tungsten silicide layer, to create a metal land structure on top surface of said second insulator layer, in said elevated shallow trench, with top surfaces of both said polycide gate structure and said metal land structure, at the same topographical level;

deposition of a fourth insulator layer;

anisotropic etching of said fourth insulator layer to create a first insulator spacer, on the sidewalls of said polycide gate structure, and on the sidewalls of said metal land structure, while removing said gate dielectric layer from regions not covered by said polycide gate structures;

ion implanting a first conductivity imparting dopant into said semiconductor substrate, in regions not covered by said polycide gate structures, to form source and drain regions;

depositing a second polysilicon layer on the top surface of said third insulator layer of said polycide gate structures, and of said metal land structures, and completely filling spaces between said polycide gate structures, and between said polycide gate structures and said metal land structures;

depositing a second tungsten silicide layer on said second polysilicon layer;

depositing a fifth insulator layer on said second tungsten silicide layer;

patterning of said fifth insulator layer, of said second tungsten silicide layer, and of said second polysilicon layer, to create a bit line contact structure, to said source and drain region, between said polycide gate structures, partially overlying said polycide gate structures, while leaving some said second polysilicon layer in spaces between said polycide gate structures and said metal land structures;

depositing a sixth insulator layer;

anisotropic etching of said sixth insulator layer to create a second insulator spacer on the sidewalls of said bit line contact structure;

deposition of a third polysilicon layer on the top surface of said bit line contact structures, on the top surface of said polycide gate structures, not covered by said bit line contact structures, on the top surface of said metal land structures, not covered by said bit line contact structures, and on said second polysilicon layer remaining in spaces between said polycide gate structures and said metal land structures;

patterning of said third polysilicon layer to create a storage node structure, of said stacked capacitor structure, between said bit line contact structures, with increased surface area resulting from said storage node structure exhibiting raised features in regions where said storage node structure overlies said bit line contact structure, and elevated shallow trench;

forming a capacitor dielectric layer on said storage node structure;

depositing a fourth polysilicon layer on said capacitor dielectric layer, on said storage node structure, and on top surface of said bit line contact structures, not covered by said storage node structures; and patterning of said fourth polysilicon layer to form cell plate structure of stacked capacitor structure.

15. The method of claim 14, wherein said first polysilicon layer is deposited using LPCVD processing, at a temperature between about 450° to 650° C., to a thickness between about 500 to 2000 Angstroms.

16. The method of claim 14, wherein bottom of said elevated shallow trench is between about 3000 to 5000 Angstroms below the top surface of said semiconductor substrate.

17. The method of claim 14, wherein said second insulator layer is silicon oxide, deposited using LPCVD or PECVD processing, at a temperature between about 600° to 800° C., to a thickness between about 1500 to 5000 Angstroms, using TEOS as a source.

18. The method of claim 14, wherein said second insulator layer, and said first insulator layer, are removed from the top surface of said first polysilicon layer using chemical mechanical polishing.

19. The method of claim 14, wherein said second insulator layer, and said first insulator layer, are removed from the top surface of said first polysilicon layer via RIE processing, using $CHF_3$ as a source.

20. The method of claim 14, wherein said first tungsten silicide layer is deposited using LPCVD procedures, at a temperature between about 400° to 700° C., to a thickness between about 500 to 1500 Angstroms, using silane and tungsten hexafluoride as a source.

21. The method of claim 14, wherein the height of said polycide gate structure, composed of said third insulator layer, of said first tungsten silicide layer, and of said first polysilicon layer, is between about 2000 to 6500 Angstroms.

22. The method of claim 14, wherein the height of said metal land structure, on said elevated shallow trench, composed of said third insulator layer, and of said first tungsten silicide layer, is between about 1500 to 4500 Angstroms.

23. The method of claim 14, wherein said first insulator spacer, on sidewalls of said polycide gate structures, and on sidewalls of said metal land structures, is silicon oxide, at a thickness between about 500 to 1500 Angstroms.

24. The method of claim 14, wherein the height of said bit line contact structure, on said polycide gate structure, composed of said fifth insulator layer, of said second tungsten silicide layer, and of said second polysilicon layer, is between about 2000 to 5500 Angstroms.

25. The method of claim 14, wherein said second insulator spacer, on the sidewalls of said bit line contact structures, is silicon oxide, at a thickness between about 500 to 1500 Angstroms.

26. The method of claim 14, wherein said raised features of said storage node structure, overlying said bit line contact structures and said elevated shallow trench, extend between about 3000 to 10000 Angstroms above top surface of the portion of said storage node structure that overlies the space between said polycide gate structures, and said metal land structures, on said elevated shallow trench.

27. A stacked capacitor structure, dynamic random access memory, (DRAM), device, on a semiconductor substrate, comprising:

insulator filled, elevated shallow trench isolation regions;

polycide gate structures, on said semiconductor substrate, between said insulator filled, elevated shallow trench regions;

metal land structures, on said insulator filled, shallow trench regions;

first insulator spacers on sidewalls of said polycide gate structures;

source and drain regions in areas of said semiconductor substrate, not covered by said polycide gate structures;

bit line contact structures between said polycide gate structures, contacting said source and drain regions, and partially overlying said polycide gate structures;

said bit line contact structures contacting said source and drain regions, and partially overlying said metal land structures on said insulator filled, shallow trench;

second insulator spacers on sidewalls of said bit line contact structures; and said stacked capacitor structure, between said bit line contact structures, contacting said source and drain region, and partially overlying said bit line contact structures, with lower electrode of said stacked capacitor structure exhibiting raised features in regions where said lower electrode overlies said bit line contact structure, while exhibiting non-raised features in regions where said lower electrode overlies said source and drain region.

28. The stacked capacitor structure, DRAM device, of claim 27, wherein said insulator filled, shallow trench, extends between about 3000 to 5000 Angstroms below the top surface of said semiconductor substrate, and extends between about 500 to 2000 Angstroms above the top surface of said semiconductor substrate.

29. The stacked capacitor structure of claim 27, wherein raised features of said lower electrode, in regions where said lower electrode overlies said bit line contact structures, extends between about 3000 to 10000 Angstroms above the top surface of said lower electrode, in regions where said lower electrode overlies source and drain regions.

* * * * *